United States Patent [19]

Evans, Jr. et al.

[11] Patent Number: 5,070,385
[45] Date of Patent: Dec. 3, 1991

[54] FERROELECTRIC NON-VOLATILE VARIABLE RESISTIVE ELEMENT

[75] Inventors: Joseph T. Evans, Jr.; Jeff A. Bullington, both of Albuquerque, N. Mex.

[73] Assignee: Radiant Technologies, Albuquerque, N. Mex.

[21] Appl. No.: 424,809

[22] Filed: Oct. 20, 1989

[51] Int. Cl.$^5$ ............... H01L 29/68; H01L 27/02
[52] U.S. Cl. ........................... 357/51; 357/23.5; 357/23.15; 365/117; 365/145
[58] Field of Search ............... 357/51, 23.5, 23.15; 365/145, 117

[56] References Cited

U.S. PATENT DOCUMENTS

| | | | |
|---|---|---|---|
| 3,675,220 | 7/1972 | Snaper et al. | 365/145 |
| 3,964,033 | 6/1976 | Wasa et al. | 365/117 |
| 4,144,591 | 3/1979 | Brody | 365/145 |

OTHER PUBLICATIONS

Land et al., *IEEE-SID Biennial Display Conf.*, N.Y., 10/12/76, "New Image . . . Light".

*Primary Examiner*—Jerome Jackson, Jr.
*Attorney, Agent, or Firm*—McCubbrey, Bartels, Meyer & Ward

[57] ABSTRACT

An improved non-volatile variable resistance element is disclosed. The resistive element is based on a semiconductor having a resistivity which is determined by the state of polarization of a ferroelectric layer.

7 Claims, 5 Drawing Sheets

FERROELECTRIC NON-VOLATILE VARIABLE RESISTIVE ELEMENT

BACKGROUND OF THE INVENTION

The present invention relates to integrated circuits and, more particularly, to a non-volatile variable resistive element which may be deposited on the surface of an integrated circuit.

The ability to construct large numbers of small variable resistors on the surface of an integrated circuit would be very advantageous. For example, so called "neuro-networks" can require hundreds of thousands of resistors. If the neuro-network is to be programmable, each of these resistors must be capable of being addressed and the resistance value changed in a continuous manner. Prior art solutions to providing such programmable resistors have been less than ideal.

For example, in one prior art solution, each resistor is constructed from a plurality of fixed resistors and switching transistors. The fixed resistors typically have resistance values which differ from one another by factors of two. The switching transistors are used to connect selected resistors in series to form the variable resistance. The specific resistors are specified by digital signals. In addition, such a system must have addressing circuitry which decodes digital signals specifying the address of the specified resistor and routes the various bits of a binary number to the various switching transistors. Since each of the fixed resistors requires an area of silicon which is larger than an FET, a variable resistor which provides even 128 resistance values requires a silicon area which is larger than that needed to construct 100 FET transistors. Hence, a circuit with 100,000 such resistors on a single chip is expensive to fabricate.

Furthermore, if power is lost, the value of each resistor is also lost. As a result, the chip would have to be reprogrammed each time power is lost. This is time consuming and requires some form of non-volatile storage for the various resistance values.

A second proposed prior art solution for providing such variable resistance elements utilizes electrically erasable read only memory cells (EEPROM) for the resistive elements. In this solution, the EEPROM cells are operated in an analog region. The resistance between the drain and source of each of the cells is determined by the amount of charge on a floating gate. Charge is transferred to and from the floating gate by tunneling mechanisms.

The EEPROM resistive elements require much smaller areas of silicon and are non-volatile; hence, they solve the above mentioned problems of a variable resistor based on fixed resistors. Unfortunately, EEPROM resistive elements have two problems. First, the time needed to program an EEPROM can be of the order of milliseconds. Hence, to program all of the resistors in a large neuro-network can require several seconds. Programming such a network can require reprogramming each resistor as many as thousands of times. Hence, EEPROM based neuro-networks can require prohibitively long programming times.

Second, EEPROM memory devices may only be reprogrammed about 10,000 times before the devices fail. As noted above, EEPROM cells operate by causing electrons to tunnel between a floating gate and some other electrode. The space between the floating gate and tunneling electrode is typically filled with silicon oxide. Some of the electrons become trapped in the oxide during each of the tunneling operations. As a result, a space charge which increases with each reprogramming accumulates. This space charge eventually prevents electrons from tunneling between the floating gate and the tunneling electrode. However, even before this charge builds up, the programming voltage needed to transfer a specified charge to the floating gate changes, making it difficult to predict the change in resistance when a given programming signal is applied to the EEPROM.

As noted above, literally thousands of reprogrammings may be needed during the programming stage of setting up a neuro-network. At each reprogramming, a predictable change in the resistance of the element must occur. As noted above, the EEPROM cell will begin to change after a few thousand reprogrammings. Hence, it is not always possible to program the network before the EEPROM elements wear out.

A third problem inherent in prior art EEPROM cells is the large voltages needed to cause the electrons to tunnel during programming and erasing operations. Voltages of the order of 17 to 25 volts are typically needed. Such voltages require isolation of the circuitry from other low voltage circuitry on the same integrated circuit chip. In addition, special circuitry for generating the high voltage from the normally available low voltage supply must also be included on the chip.

Efforts to overcome these problems utilizing ferroelectric-based materials are well known to those skilled in the art. For example, U.S. Pat. No. 2,773,250 describes a device for storing information in which the device consists of a ferroelectric body having a semiconductor layer deposited thereon. The semiconductor layer acts as a variable resistor in an electric circuit. The resistance of the semiconductor layer is controlled by the degree of polarization of the ferroelectric body. The polarization of the ferroelectric body is controlled by generating an electric field in the ferroelectric body. The electric field is generated by providing a voltages difference across the ferroelectric body. This voltage difference is generated by connecting the semiconductor layer to one voltage and a second programming electrode consisting of a conductive layer which was deposited on the other side of the ferroelectric body to a second voltage.

This resistive element, however, does not function well over long periods of time due to the materials selected. The device in question utilizes a barium titanate ferroelectric and a tellurium semiconductor. Tellurium oxidizes readily at room temperature. Hence, an oxide layer can form between the tellurium layer and the ferroelectric body as oxygen atoms drift from the barium titanate into the tellurium under the influence of the electric fields used to polarize the barium titanate. The oxide layer has a dielectric constant which is much less than that of the barium titanate. Hence, as the oxide layer forms, the voltage difference that must be applied between the programming electrode and the semiconductor to change the polarization of the barium titanate increases. After an unacceptably small number of resistive element progammings, the required voltage becomes too large for the device to be practical.

A second type of EEPROM cell based on ferroelectric materials has been proposed in the prior art. In this type of EEPROM cell, the gate oxide of a field effect transistor (FET) is replaced with a ferroelectric material such as lead lanthium zirconate titanate (PLZT). The material is polarized by placing a voltage difference between the gate of the FET and the source. The polarization gives rise to an effective space charge at the boundary between the gate oxide, and channel region. The magnitude and polarity of this space charge depends on the degree of polarization of the PLZT material and the direction of polarization, respectively. In one direction of polarization, the carrier density in the channel is reduced, leading to an increased resistance between the source and drain of the FET. The resistance value is specified by the polarizing voltage. The time to switch the polarization of the PLZT material is of the order of nanoseconds and the polarization may be switched $10^9$ times without damaging the device. Hence the above mentioned problems encountered with tunneling EEPROM cells are avoided.

Unfortunately, this type of PLZT structure is difficult to fabricate and, in practice, may be programmed only a relatively small number of times. In this type of EEPROM the electric field used to deplete the channel region is the remnant electric field resulting from the polarization of the PLZT layer. This electric field is significantly less than the electric field obtained by applying a charge to a floating gate. Hence, the depth of the channel region that can be depleted in response to this electric field is significantly less than that available in normal EEPROM cells. Channels having small depths are difficult to fabricate.

In addition, this device suffers from the same type of material incompatibilities described above with reference to the barium titanate based resistive element. In particular, no satisfactory manner has been found to protect the channel region from the metal ions in the PLZT material. The PLZT material must be crystallized on the silicon substrate at temperatures of 500° C. At these temperatures, the lead ions diffuse into the channel region. These metal ions change the electrical properties of the channel in a manner analogous to doping the channel with metal ions to control its carrier density.

If a barrier such as silicon dioxide is deposited before the PLZT material to protect the channel drifting ions, the programming voltage is increased to an unacceptable value. The EEPROM is normally programmed by applying a voltage between the gate of the FET and the channel region. Systems requiring large programming voltages are very expensive to fabricate. The available barrier materials are insulators with a dielectric constant significantly less than that of the PLZT material. Consider the case in which a voltage is applied between the channel and gate of the EEPROM to polarize the PLZT layer. Part of the voltage will appear across the barrier material and the remainder will be appear across the PLZT material. The fraction appearing across the PLZT layer is determined by the relative dielectric constants of the barrier material and the PLZT material. In general, the PLZT materials have much higher dielectric constants than the available barrier materials. As a result, most of the voltage appears across the barrier material. It has been found that the inclusion of such a barrier increases the programming voltage to more than 100 volts.

Although the direction and magnitude of the remnant polarization of the PLZT material can be altered more than $10^9$ times, the observed life-time of this type of EEPROM is less than that of conventional EEPROM cells. The short life-time is the result of a different form of ion drift. The PLZT materials include oxygen atoms which can drift in response to the voltages used to change the remnant polarization in the PLZT layer. As noted above, to alter the remnant polarization, a voltage must be applied across the PLZT layer. This is normally accomplished by applying a voltage between the channel region of the FET and the gate electrode. The magnitude of this voltage is sufficient to cause ions to drift. Depending upon the direction of the applied voltage differences, ions will either drift from the PLZT layer into the channel region or from the channel region into the PLZT layer. When oxygen ions drift from the PLZT layer into the channel region, they form a silicon dioxide layer at the interface between the PLZT layer and the channel region. As noted above, silicon dioxide is an insulator with a low dielectric constant. As a result, the programming voltage slowly increases with time.

Accordingly, it is an object of the present invention to provide an improved programmable non-volatile resistive element.

It is another object of the present invention to provide a resistive element that can be reprogrammed more times than existing variable resistive elements.

It is yet another object of the present invention to provide a resistive element that can be more economically fabricated than resistive elements based on EEPROM cells.

These and other objects of the present invention will become apparent to those skilled in the art from the following detailed description of the invention and the accompanying drawings.

SUMMARY OF THE INVENTION

The present invention comprises a resistive element comprising a polarizable layer having first and second surfaces. A first contact is bonded to the polarizable layer adjacent to the first surface. The first contact is an electrical conductor. The resistive element also includes a second contact bonded to the polarizable layer adjacent to the second surface. The second contact comprises a semiconducting material. The material of the polarizable layer and the semiconducting material are chosen such that ions drifting between the polarizable layer and said second contact do not give rise to a layer having a dielectric constant substantially less than that of said first material, said layer being between the polarizable layer and said second contact.

DETAILED DESCRIPTION OF THE INVENTION

Figure 1A:
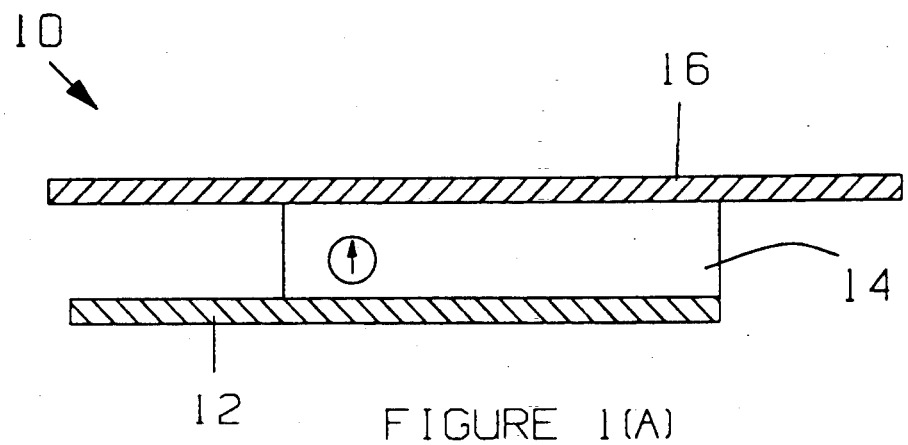
FIG. 1(a) is a cross-sectional view of a resistive element 10 according to the present invention.
Figure 1B:
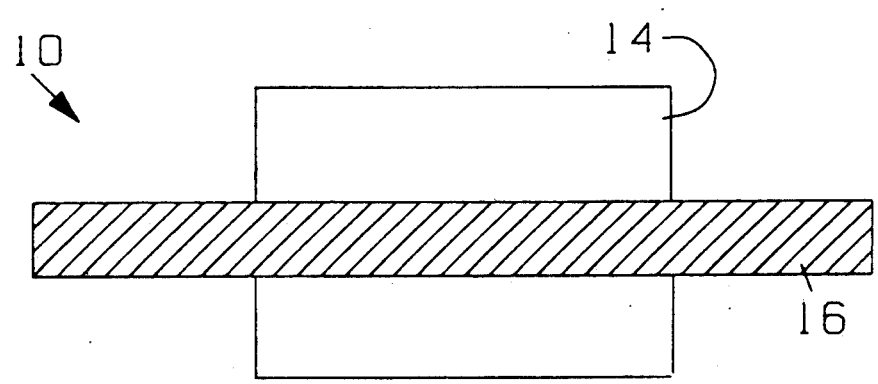
FIG. 1(b) is a top view of resistive element 10 shown in FIG. 1(a).

The basic geometry of a resistive element according to the present invention is illustrated in FIGS. 1(a)–(b). FIG. 1(a) is a cross-sectional view of a resistive element 10 according to the present invention. FIG. 1(b) is a top view of resistive element 10. Resistive element 10 includes three layers; a bottom electrode 12, a ferroelectric layer 14, and a semiconductor contact 16. Bottom electrode 12 may be constructed from any conducting material, or, as will be discussed in more detail below, it can be constructed from a semiconductor material such as that used to construct semiconductor contact 16. Ferroelectric layer 14 is preferably constructed from a ferroelectric material. PLZT materials are preferred. For example, a PLZT composition consisting of 98% lead, 2% lanthanum, 40% zirconium, and 60% titanium may be utilized in constructing a resistive element according to the present invention.

Semiconductor contact 16 can be constructed from any material with an appropriate carrier density in the intended operating temperature range of the device in which resistive element 10 is to be utilized provided the material will interface properly with ferroelectric layer 14. The material utilized for semiconductor contact 16 must satisfy three requirements. First the material must provide a resistivity within the range needed for the particular circuit in which resistive element 10 is to be utilized.

Second, the material must be substantially electrochemically inert with respect to the ferroelectric material utilized for ferroelectric layer 14. As noted above, one problem with prior art EEPROM devices which utilize ferroelectric materials for the gate oxide is the migration of ions between the channel region and the ferroelectric region. To prevent such drift in resistive element 10, semiconductor contact 16 is preferably constructed from a material which will not be effected by ions drifting from ferroelectric layer 14. If PLZT materials are used for ferroelectric layer 14, semiconductor contact 16 may be constructed from an appropriate metal oxide such as the oxides of tin, indium, beryllium, zinc, cadmium, nickel, etc. Since such oxides are already stabilized against oxygen ions, any oxygen drifting from the PLZT material will not result in an insulator being formed at the interface of ferroelectric layer 14 and semiconductor contact 16. However, it will be apparent to those skilled in the art that bromides, carbides, silicides, nitrides, and sulfides may also be utilized.

Third, semiconductor contact 16 must be capable of deposition on ferroelectric layer 14 without destroying ferroelectric 14. For example, if a PLZT material is used for ferroelectric layer 14, the material used for semiconductor contact 16 must be depositable in a non-reducing atmosphere at a suitably low temperature.

A resistive element according to the present invention may be fabricated on a silicon wafer with conventional CMOS circuit elements. The resistive element is preferably fabricated after the CMOS fabrication has reached the point at which the metal interconnects are to be deposited.

FIG. 3 illustrates the manner in which a resistive element according to the present invention may be fabricated in conjunction with two conventional FET transistors 22 and 26. FIG. 3(a)–(e) are cross-sectional views through a silicon wafer 21 at various stages in the fabrication process. FIG. 3(a) shows the wafer after the wells, gate oxide layers 25, and gate electrodes 24 have been fabricated.

Figure 3A:
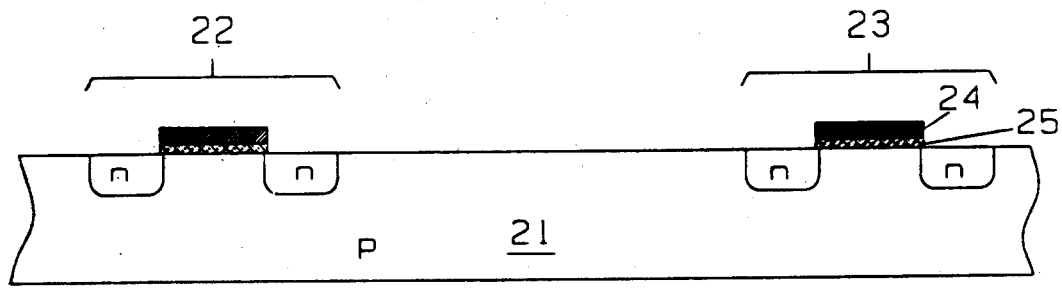
FIG. 3(a)–(e) are cross-sectional views of a wafer showing the various steps in constructing a resistive element according to the present invention.
Figure 3B:
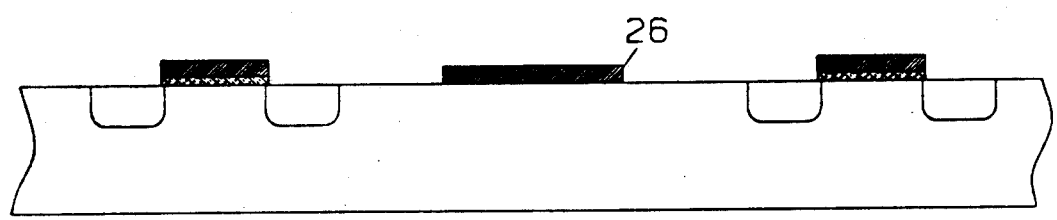

At this point, the wafer is covered with a diffusion barrier such as silicon oxide or silicon nitride. Bottom electrode 26 is then deposited using a thin glue layer to bond it to the barrier layer. A bottom electrode comprising a 0.2 micron thick platinum layer is preferred. The glue layer is preferably several hundred angstroms of titanium. After deposition, the bottom electrode is etched to the appropriate shape as shown in FIG. 3(b) using conventional integrated circuit fabrication methods.

Figure 3C:
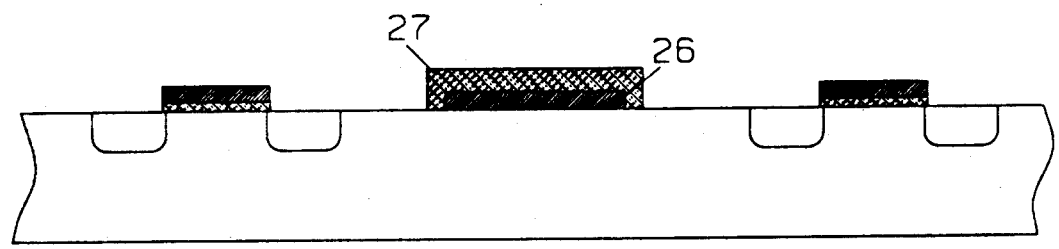

Next, the ferroelectric film is deposited and etched to the appropriate shape. Conventional deposition and etching techniques such as those noted below may be utilized. For example, Title, et al. describe a technique for etching PLZT thin films [Mark A. Title, et al., "Reactive Ion Beam Etching of PLZT Electrooptic Substrates with Repeated Self-Aligned Masking", *Applied Optics*, Vol. 25, No. 9, 1986]. FIG. 3(c) shows the ferroelectric layer 27 after etching.

Figure 3D:
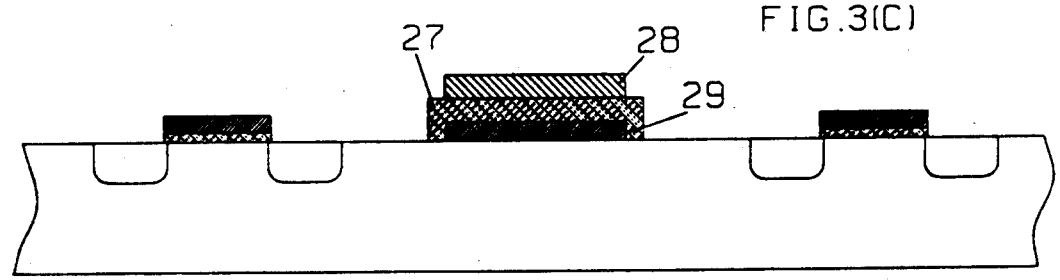

The semiconductor contact 28 is then deposited. This is preferably accomplished utilizing a conventional sputtering process such as that described by David Fraser ["Sputtered Films for Display Devices", *Proceedings of the IEEE*, 61, 1973]. The semiconductor contact is preferably a 200 angstrom thick layer of tin oxide. Once the semiconductor is deposited, it may be doped to the desired carrier concentration by conventional diffusion or ion implantation techniques. Alternatively, the doping elements can be included in the material that is deposited. The semiconductor contact is then etched to the desired geometry using conventional integrated circuit techniques. FIG. 3(d) shows the device after semiconductor 28 contact has been etched.

Figure 3E:
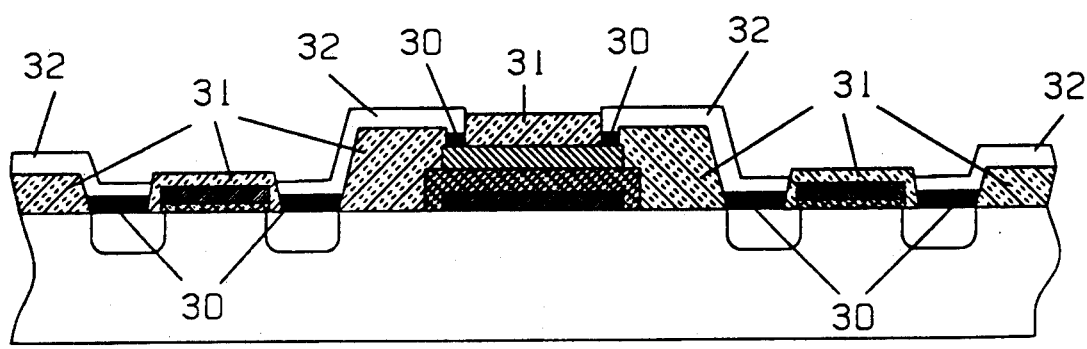

Next, an interlayer dielectric 31 which is preferably a low temperature silicon dioxide layer is deposited. Wells in the interlayer dielectric 31 are then opened at those locations which are to be electrically connected to metalization. A layer of titanium nitride 30 is deposited as a barrier between the aluminum metalization and contact materials. The aluminum metalization is deposited in the final step. The wafer after the deposition of the aluminum is shown in FIG. 3(e).

Referring again to FIG. 1, the resistance, R, of semiconductor contact 16 is determined by the resistivity, p, of the material used to construct semiconductor contact 16, the length, L, width, W, and thickness, T, of semiconductor contact 16. In general, $$R = pL/(WT) \quad (1)$$

Figure 2:
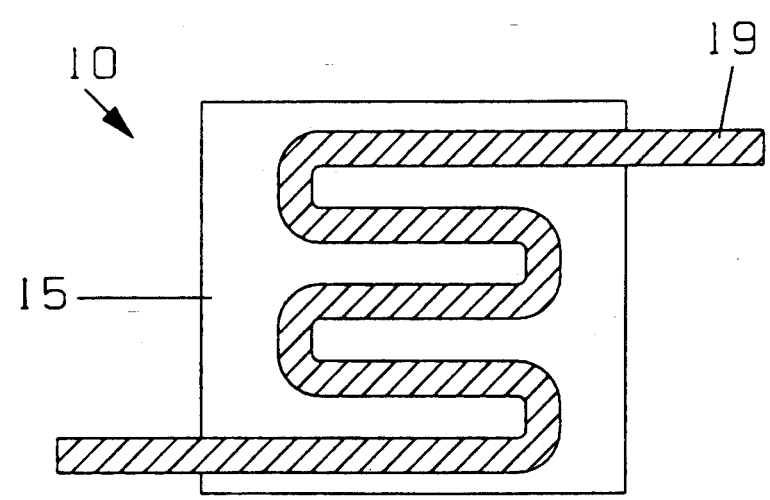
FIG. 2 is a top view of an alternative embodiment of a resistive element according to the present invention.

The length of semiconductor contact 16 may be increased by utilizing a serpentine configuration such as that shown in FIG. 2 which is a top view of an alternative resistive element 10 having a semiconductor contact 19 and ferroelectric layer 15.

The resistivity of semiconductor contact 16 is determined by the degree of polarization of ferroelectric layer 14, the density of carriers in semiconductor contact 16 in the absence of polarization of ferroelectric layer 14, and the type of semiconductor utilized for semiconductor contact 16. The resistivity of the material utilized to construct semiconductor contact 16 in the absence of an electric field will be referred to as the intrinsic resistivity of the material. For example, tin oxide has a resistivity of approximately 0.05 ohm-cm in the absence of any doping. This resistivity may be dramatically decreased by doping the material. For example, indium doped tin oxide may have an intrinsic resistivity of about $10^{-4}$ ohm-cm.

When ferroelectric layer 14 is polarized, an electric field is generated in semiconductor contact 16. This field will either draw additional carriers into semiconductor contact 16 or repel the existing carriers out of semiconductor contact 16, depending upon the direction of polarization and the type of semiconductor. If additional carriers are drawn into semiconductor contact 16, the resistance of semiconductor contact 16 will be decreased. If the carriers are repelled therefrom, the resistance of semiconductor contact 16 will be increased.

It should be noted that the thickness of the semiconductor contact 16 affects the operation of the device in two ways. First, if the thickness is too great, the electric field generated by the ferroelectric layer will not affect the carrier density far from the interface of the semiconductor contact and ferroelectric layer. If the resistive element is being operated in a depletion mode, i.e., the electric field is expelling carriers from semiconductor contact 16, then the portion of the semiconductor contact far from the interface will not be depleted. As a result, the resistive element will behave in a manner analogous to two resistors in parallel. The first resistor will be the depleted region near the interface and the second resistor will be the non-depleted region. Since the non-depleted region will have a resistance which is less than that of the depleted region, the resistance values obtainable will be limited by the resistance of the non-depleted region.

Second, if the thickness of the semiconductor contact is sufficiently small to avoid creating two resistors in parallel, it may be shown that the resistivity of the semiconductor contact is proportional to the thickness thereof. Hence, the resistance of the resistive element will no longer depend on the thickness of the semiconductor contact.

Ferroelectric layer 14 is polarized by applying a voltage between semiconductor contact 16 and bottom electrode 12. This voltage will be referred to as the programming voltage in the following discussion. The resistivity of semiconductor contact 16 is a function of the programming voltage. However, since ferroelectric materials exhibit hysteresis, the programming must be commenced from the same initial state of polarization. This can be accomplished by applying a voltage which saturates the ferroelectric material and then changing the voltage from that value to the desired value.

Hysteresis effects are less critical in digital applications wherein the resistance is to be switched between the minimum and maximum possible values. In this case, the ferroelectric layer is polarized such that it is polarized to the maximum possible value, and only the direction of the polarization is changed. In this case, the prior state of polarization will not effect the polarization, since the device is programmed by applying the saturating voltage to the ferroelectric material.

Figure 4:
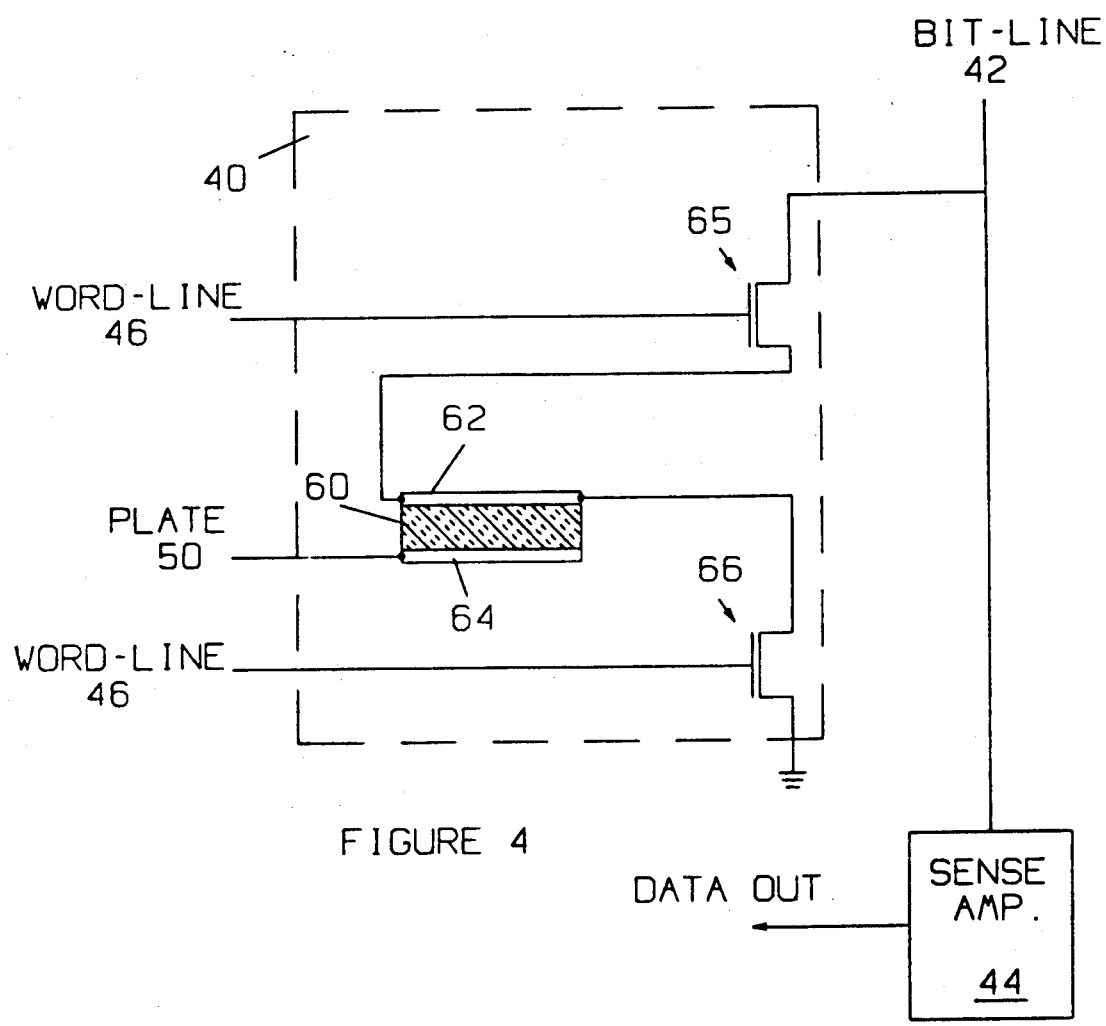
FIG. 4 illustrates a memory cell utilizing the present invention.

A resistive element according to the present invention can be used to construct a non-volatile static memory for use in computers and the like. A single memory cell in one embodiment of such a memory is illustrated in FIG. 4 at 40. Cell 40 includes a resistive element according to the present invention which is constructed from a ferroelectric layer 60, a semiconductor contact 62, and a bottom electrode 64. The resistive element is isolated from a bit line 42 by a first transistor 65 and from ground by a second transistor 66. The data stored in the resistive element is sensed by sense amplifier 44.

Cell 40 is programmed and read by applying the appropriate voltages to word-lines 46 and 48 and plate 50. To program cell 40, bit-line 42 is set to the desired value, high or low. Word-line 46 is turned on, word-line 48 is turned off. Plate 50 is then pulsed. If bit-line 42 is low during programming, the pulse on plate 50 will polarize ferroelectric 60 such that the electric field vector is down. Hence, excess electrons will be held in semiconductor contact 62. For an N-type semiconductor material such as tin oxide, this will decrease the resistivity of semiconductor contact 62. If bit-line 42 is high during programming, the ferroelectric material will be polarized such that the electric field vector is up. This will deplete semiconductor contact 62 of electrons. For an N-type semiconductor, this will result in semiconductor contact 62 being placed in a highly resistive state. If a P-type semiconductor were utilized, the opposite states would result.

To read the cell state of cell 40 when an N-type semiconductor is utilized, bit line 42 is charged to a voltage which is small compared to that used to program cell 40. The use of a low voltage prevents ferroelectric layer 60 from changing direction of polarization. Transistors 65 and 66 are then turned on. After a time depending on the capacitance of bit-line 42 and the minimum resistance of cell 40, sense amplifier 44 is turned on. Sense amplifier 40 is connected to a reference voltage which is related to the voltage to which bit-line 42 was charged. By comparing the voltage on the discharged bit-line, the resistance of semiconductor contact 62 in cell 40 may be measured. The different possible resistance values of semiconductor contact 62 will discharge bit-line 42 at different rates. Hence, the voltage on bit-line 42 after an appropriate time has elapsed will allow the resistance of semiconductor contact 62 to be ascertained.

It should be noted that the first time cell 40 is read after being programmed, the resistance of semiconductor contact 62 may change slightly. If the read voltage is in a direction that changes the polarization vector of ferroelectric layer 60, the remnant polarization of some of the domains in ferroelectric layer 60 may be switched to the opposite direction thereby changing the overall remnant polarization. The fraction of the domains will be small if the read voltage is small compared to that used to program cell 40. In addition, the read voltage must be significantly less than the saturation voltage of ferroelectric layer 60. However, once the domains in question have switched, no further switching will occur on repeated reads.

Figure 5:
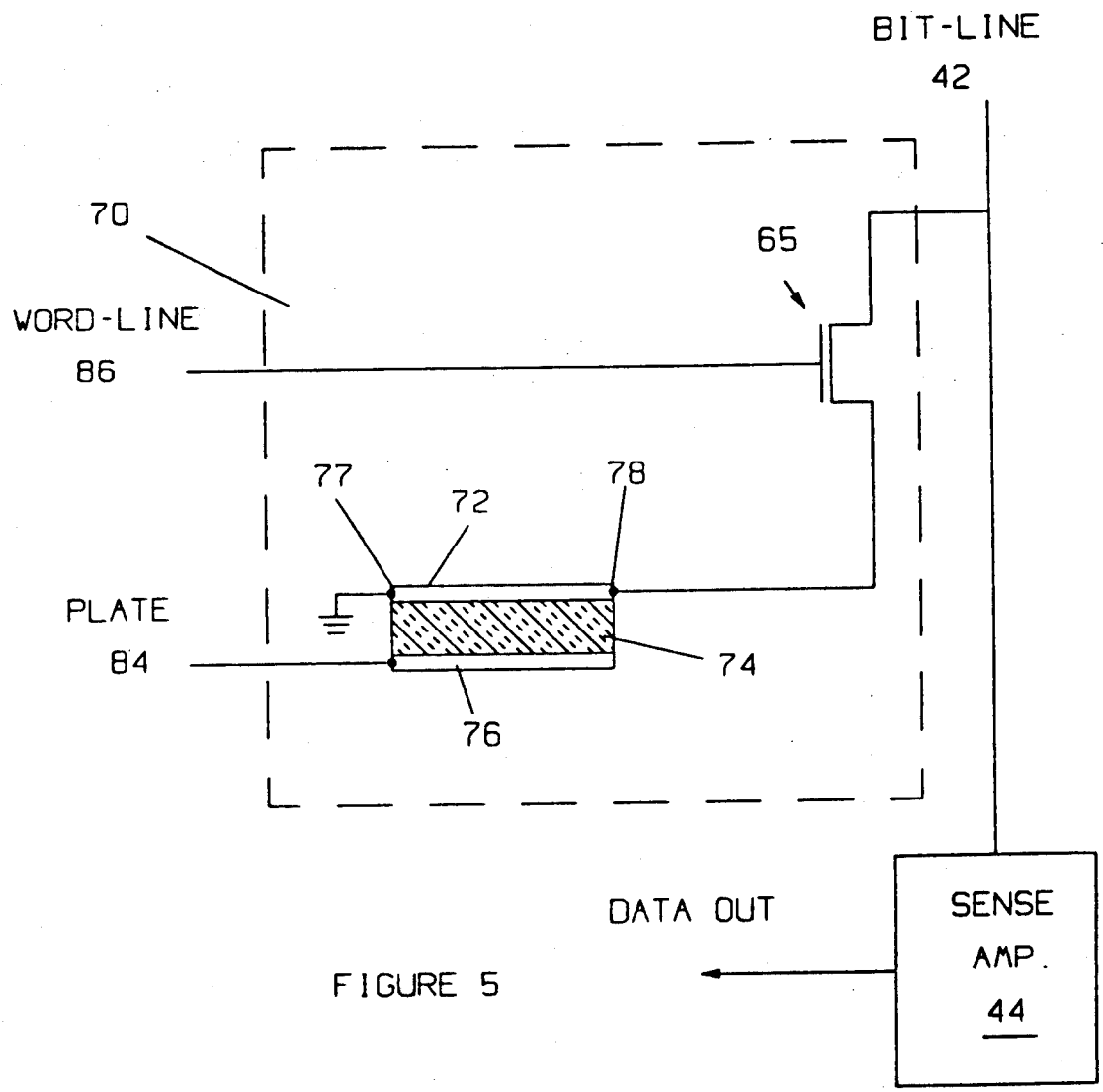
FIG. 5 illustrates a second memory cell utilizing the present invention.

A one isolation transistor memory cell is shown in FIG. 5 at 70. Cell 70 utilizes a resistive element comprising a semiconductor contact 72, ferroelectric layer 74, and bottom electrode 76. Cell 70 is isolated from bit line 42 by transistor 65 which is controlled by word-line 86. The voltage on the bottom electrode 76 is specified by the voltage on plate 84.

Cell 70 has the advantage of requiring only one isolation transistor. It is programmed in a manner analogous to that described above with reference to cell 40. The data to be programmed is placed on bit-line 42. Transistor 65 is turned on, and plate 84 is pulsed.

Cell 70 is read in an analogous manner. Bit-line 42 is precharged to a voltage which is small compared to that used to program cell 70. Transistor 65 is turned on.

After an appropriate time interval has elapsed, sense amplifier 44 is used to compare the voltage on bit-line 42 to a reference value.

Cell 70 differs from cell 40 in that the type of semiconductor used to construct semiconductor contact 72 is important. Consider the case in which semiconductor contact 72 is an N-type semiconductor. When the cell is programmed with a low voltage, i.e., ground, on bit-line 42, there will not be a voltage difference across semiconductor contact 72. That is, both ends, 77 and 78, of semiconductor contact 72 will be at the same voltage. As a result, the polarization of ferroelectric layer 74 will be uniformly in one direction and semiconductor contact 72 will be in the low resistant state.

Now consider the case in which a high programming voltage is present on bit-line 42. In this case, there will be a voltage drop across semiconductor contact 72. End 78 will be at the high voltage and end 77 will be held at ground. In this case, the portion of ferroelectric layer 74 under end 77 will be polarized in a direction different from that under end 78. End 78 will become highly resistive when the voltage switches. Hence, the voltage drop will be concentrated at end 78. Since the voltage drop determines the state of ferroelectric layer 74, only that portion of ferroelectric layer under end 78 will switch its direction of polarization. This results in a non-uniform resistance distribution across semiconductor contact 72.

In the case of an N-type semiconductor and positive programming voltages, the resistance of end 78 will be much higher than that of end 77; however, the resistance of semiconductor contact 72 in the state corresponding to a high programming voltage will still be much higher than that corresponding to a low programming voltage. As a result, the memory device still functions adequately. However, the difference in resistance of the high and low states is substantially reduced which decreases the performance of cell 70.

Now consider the case in which a P-type semiconductor has been utilized for semiconductor contact 72 with the same positive voltage programming scheme. Again, when both sides of semiconductor contact 72 are held at ground during programming, the polarization on ferroelectric layer 74 is uniform and no problems are encountered. In this case, the resistance of the entire semiconductor contact 72 is uniformly high. If a high programming voltage is applied at end 78, the voltage across ferroelectric layer 74 below end 78 goes high and that at end 77 remains at ground. The high voltage at end 78 causes the polarization to switch directions at the end of ferroelectric layer 74 under end 78. This lowers the resistance of semiconductor contact 72 at end 78. As this happens, the high voltage then moves toward end 77 and the process repeats until semiconductor contact 72 is uniformly at a low resistance state. Hence, this choice of semiconductor material has the same high ratio of resistances in the high and low programming states as does the two transistor version shown in FIG. 4.

While the above description of memory cells 40 and 70 utilized voltages between a bit-line and ground, it will be apparent to those skilled in the art that the ground connection could be replaced by a drive line.

The ability to alter the state of polarization of a ferroelectric layer will decrease with each reprogramming slightly. Hence, the reference voltage utilized by the sense amplifiers shown in FIGS. 4 and 5 will slowly change with time. This limits the number of write cycles to about $10^{10}$ when PLZT materials are utilized. The number of write cycles can be increased significantly by utilizing a memory cell in which the bottom electrode is also a semiconductor. In this case, the resistance of the bottom electrode acts as a reference when measuring the resistance of the top electrode.

Figure 6:
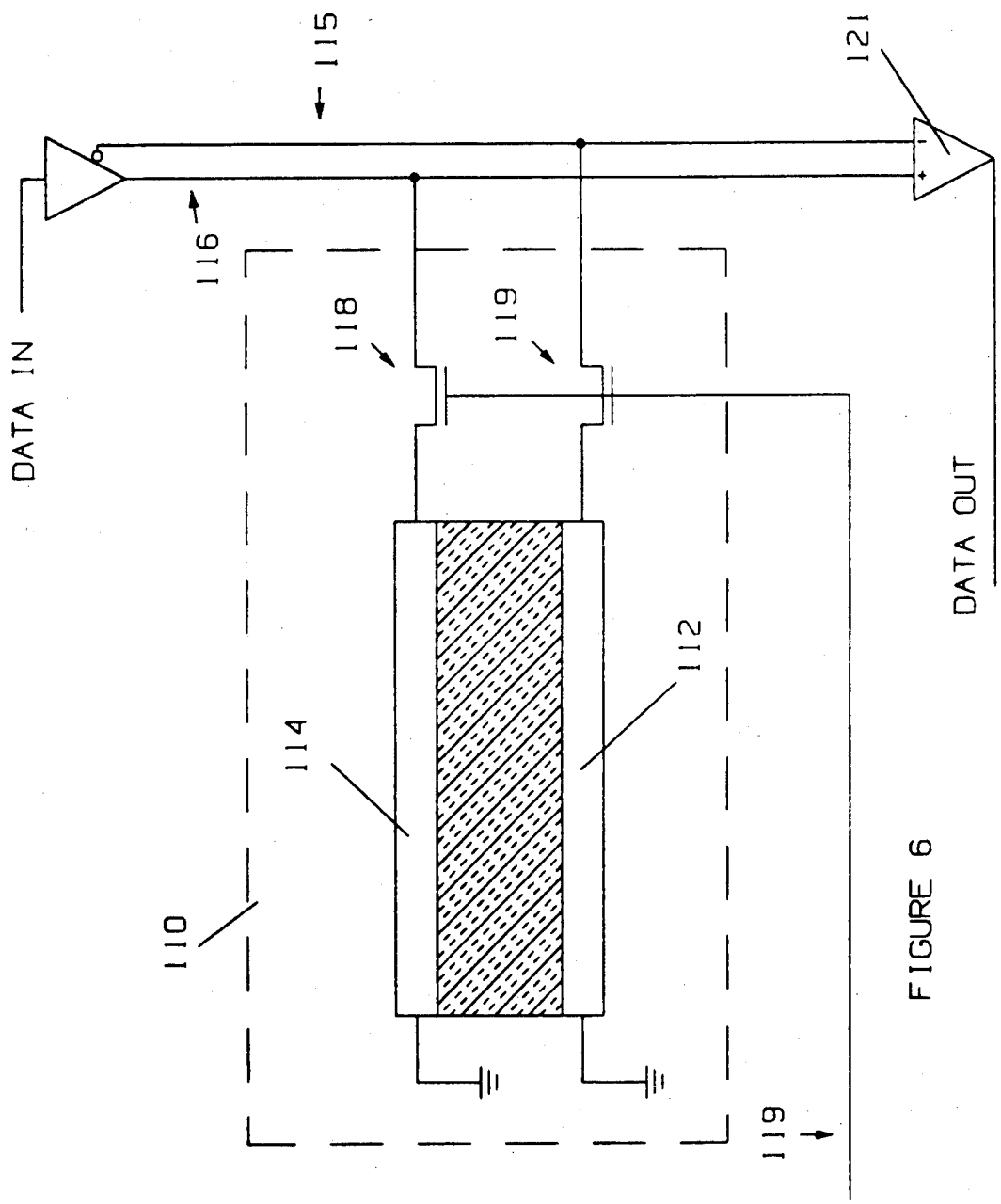
FIG. 6 illustrates a memory cell according to the present invention in which the bottom electrode is also a semiconductor.

FIG. 6 illustrates a memory cell 100 utilizing a resistive element 110 in which the bottom electrode 112 is a semiconductor. Bottom electrode 112 is connected to line 115. The top electrode 114 which is also a semiconductor is connected to line 116. Cell 100 is isolated from the lines in question by transistors 118 and 119 which are controlled by the voltage on select line 117. The state of cell 100 can be sensed by operational amplifier 121.

Cell 100 is programmed by placing the data on line 115 and the complement thereof on line 116 after selecting cell 100 with a high voltage on select line 119. Cell 100 is read by precharging both lines and then reading the voltage output of amplifier 121 after transistors 118 and 119 have been turned on for a suitable period of time.

While the present invention has been described in terms of embodiments utilizing PLZT materials, it will be apparent to those skilled in the art that other polarizable materials may be utilized. For example, lead zirconate titanates may be utilized, as well as other ferroelectric materials.

There has been described herein a novel resistive element. Various modifications to the present invention will become apparent to those skilled in the art from the foregoing description and accompanying drawings. Accordingly, the present invention is to be limited solely by the scope of the following claims.

What is claimed is:

1. A resistive element comprising:
   a polarizable layer having first and second surfaces comprising a first material;
   a first contact bonded to said polarizable layer adjacent to said first surface, said first contact being an electrical conductor; and
   a second contact bonded to said polarizable layer adjacent to said second surface, said second contact comprising a semiconducting material which is doped such that the resistance of said second contact changes in response to a change in the polarization of said polarizable layer, said second contact further comprising first and second electrical connections disposed on said second contact such that the resistance of said second contact can be determined by connecting an electrical circuit between said first and second electrical connections, wherein first material and said semiconducting material are chosen such that ions drifting between said polarizable layer and said second contact do not give rise to a layer between said polarizable layer and said second contact having a dielectric constant substantially less than that of said first material.

2. The resistive element of claim 1 wherein said first material comprises a lead zirconate titanate and said semiconducting material comprises an oxide, bromide, carbide, nitride, or sulfide of an element.

3. The resistive element of claim 2 wherein said element is chosen from the group comprising tin, indium, beryllium, zinc, cadmium, and nickel.

4. The resistive element of claim 1 wherein said first material comprises a lead lanthanum zirconate titanate and said semiconducting material comprises an oxide, bromide, carbide, nitride, or sulfide of an element.

5. The resistive element of claim 2 wherein said element is chosen from the group comprising tin, indium, beryllium, zinc, cadmium, and nickel.

6. The resistive element of claim 1 wherein said first contact comprises a semiconductor.

7. A resistive element comprising:
a polarizable layer having first and second surfaces comprising a first material;
a first contact bonded to said polarizable layer adjacent to said first surface, said first contact comprising a semiconducting material which is doped such that the resistance of said first contact changes in response to a change in the polarization of said polarizable layer; and
a second contact bonded to said polarizable layer adjacent to said second surface, said second contact comprising a semiconducting material which is doped such that the resistance of said second contact changes in response to a change in the polarization of said polarizable layer, said second contact further comprising first and second electrical connections disposed on said second contact such that the resistance of said second contact can be determined by connecting an electrical circuit between said first and second electrical connections
wherein first material and said semiconducting material are chosen such that ions drifting between said polarizable layer and said second contact do not give rise to a layer between said polarizable layer and said second contact having a dielectric constant simultaneously less than that of said first material.

* * * * *